United States Patent [19]
Kline

[11] Patent Number: 5,903,164
[45] Date of Patent: May 11, 1999

[54] ACTIVE WAFER LEVEL CONTACTING SYSTEM

[75] Inventor: Eric Kline, Stillwater, Minn.

[73] Assignee: JohnsTech International Corporation, Minneapolis, Minn.

[21] Appl. No.: 08/747,215

[22] Filed: Nov. 12, 1996

Related U.S. Application Data

[60] Provisional application No. 60/006,432, Nov. 13, 1995.

[51] Int. Cl.$^6$ .............................. G01R 31/26; H01L 21/66
[52] U.S. Cl. .............................. 324/765; 324/754; 438/14
[58] Field of Search ................................... 324/754, 765; 438/14, 17, 18; 257/48; 365/201

[56] References Cited

U.S. PATENT DOCUMENTS

| | | | |
|---|---|---|---|
| 5,070,297 | 12/1991 | Kwon et al. ............................. | 324/754 |
| 5,140,405 | 8/1992 | King et al. ............................... | 257/727 |
| 5,266,890 | 11/1993 | Kumbasar et al. .................. | 324/158.1 |
| 5,532,610 | 7/1996 | Tsujide et al. ........................... | 324/757 |
| 5,701,666 | 12/1997 | DeHaven et al. .................... | 324/754 X |

Primary Examiner—Glenn W. Brown
Attorney, Agent, or Firm—Nawrocki, Rooney & Sivertson, P.A.

[57] ABSTRACT

Apparatus for use in testing a semiconductor device located on a wafer. The apparatus includes a wafer body. A device contact region is located on the wafer body. Further, an active component region is coupled to the device contact region. A mechanism is provided for coupling the active component region to a remote testing device. The active component region may include test signal conditioning circuits and device testing circuits. The active component region may be formed integral the wafer body by silicon wafer processing techniques, such as silicon doping.

23 Claims, 10 Drawing Sheets

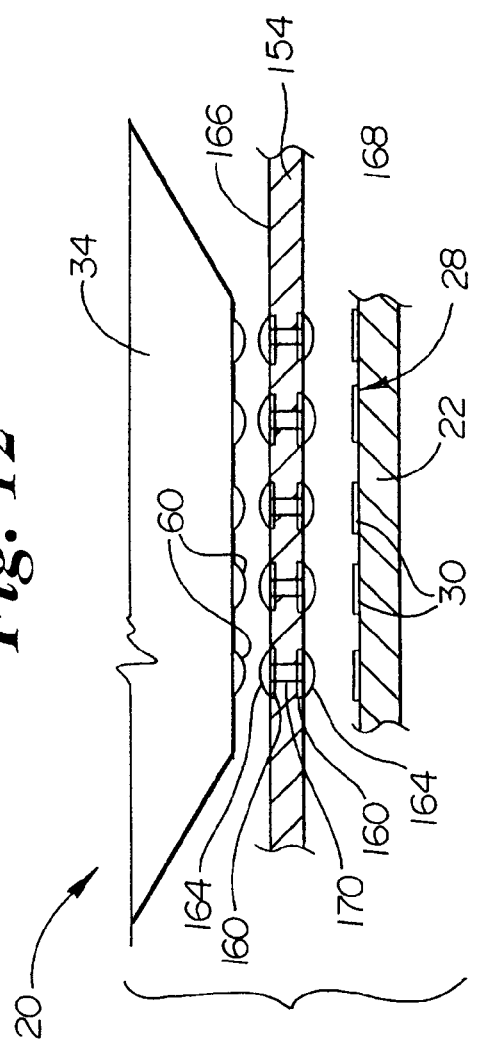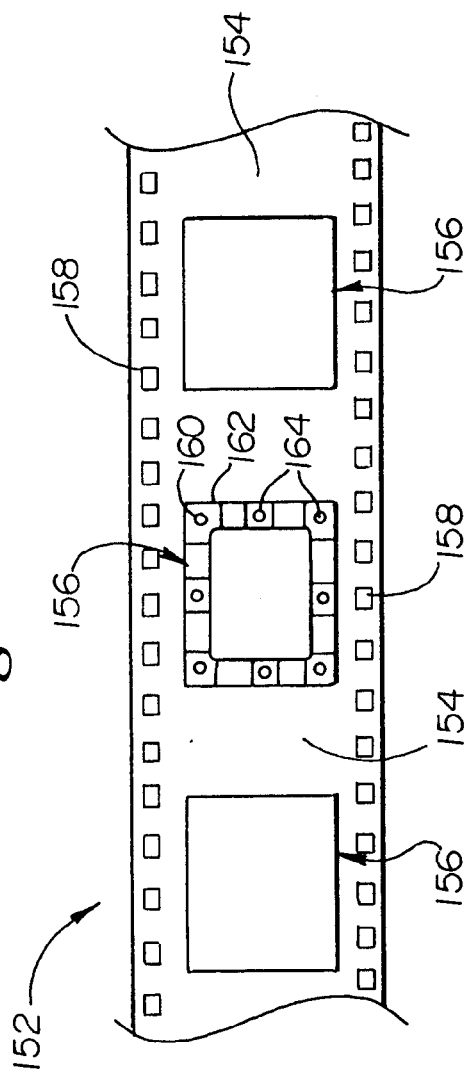

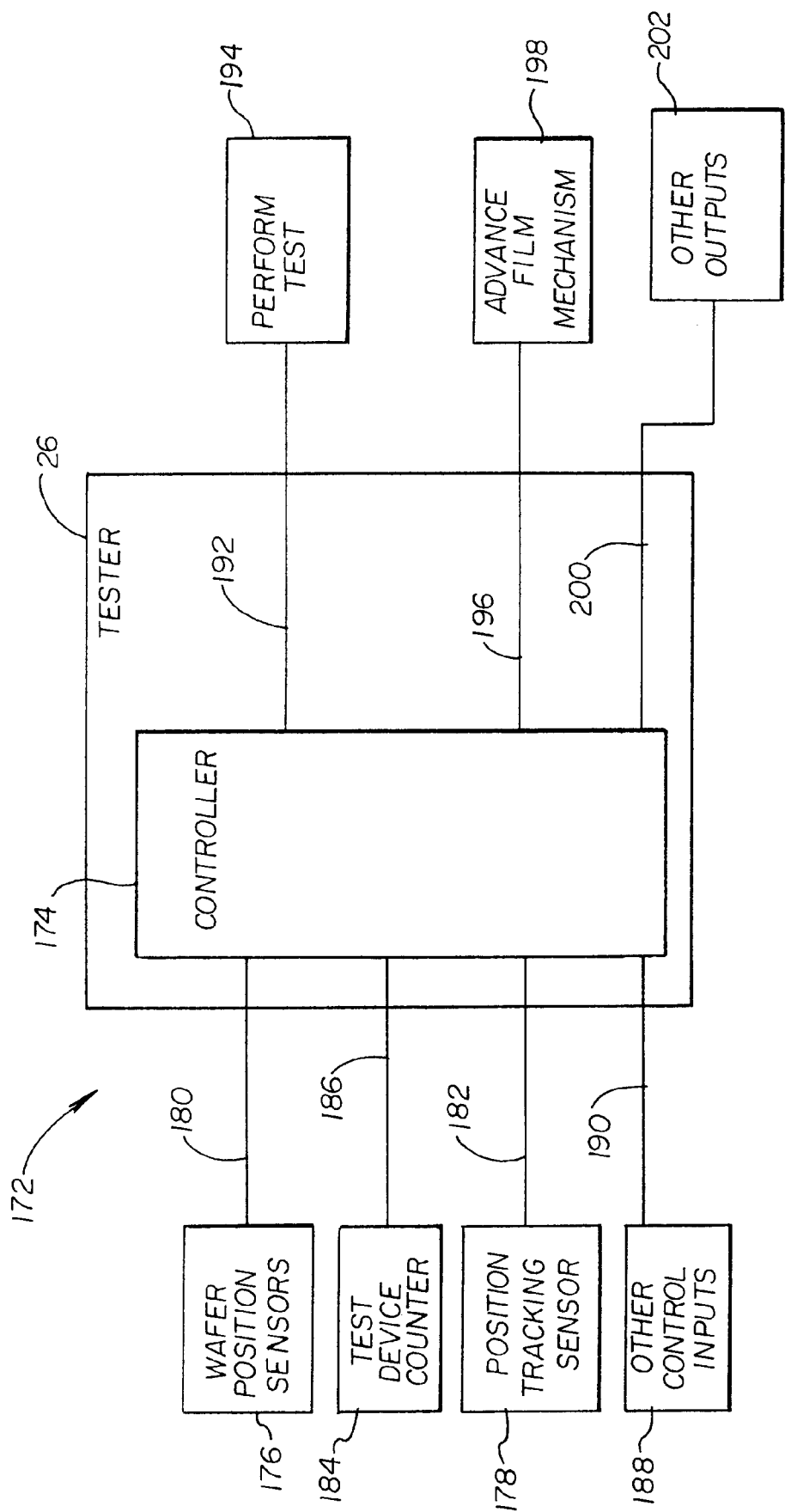

ACTIVE WAFER LEVEL CONTACTING SYSTEM

This application claims priority under 35 U.S.C. §119(e)(1) to co-pending U.S. Provisional Patent Application Ser. No. 60/006,432, filed Nov. 13, 1995, entitled "Active Wafer Level Contacts", which is assigned to the assignee of the present invention and is incorporated herein by reference.

BACKGROUND OF THE INVENTION

The present invention deals broadly with the field of electrical interconnect and testing systems for integrated circuits. More narrowly, however, the invention is related to an active wafer level contacting system for coupling an integrated circuit device positioned on a wafer with a tester intended to effect test analysis of the integrated circuit device. The preferred embodiment of the present invention includes an active wafer level contact system having at least a portion of the signal conditioning or integrated circuit test system located on the active wafer level contacting system.

In a typical semi-conductor production facility, each integrated circuit is tested using a tester apparatus. The tester apparatus may be connected to the integrated circuit through an interconnection system. The tester apparatus may test the functionality and performance of an integrated circuit through the interconnection system.

As modern semi-conductor devices increase in performance, for example speed, the manufacturer's ability to test these devices "at speed" has become increasingly more difficult. The testing of high performance semiconductor devices require precise impedance matching and minimal parasitic capacitance to limit distortion of the performance characteristics of the device under test.

Typically, integrated circuits are mass produced on a silicon wafer using integrated circuit wafer processing techniques. After the manufacturing of the integrated circuits is completed, each integrated circuit is removed from the silicon wafer for packaging. It has been proven to be highly cost effective and less time consuming to test the individual integrated circuits while they are still positioned on the wafer.

One prior art wafer level contacting device is a probe card contacting system. The probe card contacting system includes an opening which is larger than the integrated circuit device under test. Extending from the probe card through the opening are relatively rigid, fixed position metallic pins having sharpened points. The number of pins correspond to the number of input/output (I/O) pads on the semiconductor device. As the probe card is positioned over the integrated circuit device, the sharpened points on the metallic pins make direct contact with the corresponding I/O pads on the integrated circuit device under test, with the long cantilevered pins conducting electrical signals between the integrated circuit device under test and the probe card.

Coupled to the probe card is a tester for testing various performance characteristics of the integrated circuit device under test. The probe card may also include termination circuits, for example, resistors and capacitors, to condition the test signal output to the tester.

It is desirable to provide a wafer level contacting system for testing of high performance integrated circuit devices "at speed". The wafer level contacting system should provide signal conditioning, including precise impedance matching and minimal parasitic capacitances. Further, it is desirable to have an "active" wafer contacting system having active circuit devices integrated into the wafer level contacting system for a highly efficient, economical testing system.

It is to these dictates and shortcomings of the prior art that the present invention is directed. It is an active wafer level contacting system which addresses the dictates of the prior art and resolves problems thereof.

SUMMARY OF THE INVENTION

The present invention is related to an active wafer level contacting system for coupling an integrated circuit device positioned on a wafer with a tester intended to effect test analysis of the integrated circuit device. The preferred embodiment of the present invention includes an active wafer level contacting system having at least a portion of the signal conditioning or integrated circuit test system located on the active wafer level contacting system.

In one embodiment, the present invention is an apparatus for use in testing a semiconductor device located on a wafer. The apparatus includes a wafer body. A device contact region is located on the wafer body for contacting the semiconductor device. An active component region is coupled to the device contact region. Means are provided for coupling the active component region to a remote testing device.

The wafer body may be formed of silicon. The device contact region may further include contact elements located within the device contact region in a location corresponding to the I/O pads on the semiconductor device. In one preferred embodiment, the contact elements are formed of solder bumps.

The active component region may include circuit components located integral the wafer. The circuit components may be formed using silicon wafer processing techniques, such as silicon doping. The active component region may include a signal conditioning circuit or a semiconductor device test circuit. The semiconductor device test circuit may include a memory chip, microprocessor, transistor, or logic gates. Further, it is recognized that the active component region may include a test system for testing the semiconductor device.

The means for coupling may include a large pad contact region. Further, the means for coupling may include a cable termination device.

In one embodiment, the wafer body is flexible. The flexible wafer body is secured to a rigid support member. The rigid support member includes a sloped region and a flat region, wherein the contact region is coupled to the flat region, and the active component region is coupled to the sloped region. Alternatively, it is recognized that the wafer body may be generally rigid.

In an alternative embodiment, the wafer body may include a first silicon substrate and a second silicon substrate coupled to the first silicon substrate. The contact region may be located on the first silicon substrate, and the active component region may be located on the second silicon substrate.

The present invention may further include a changeable contact system having a changeable device contacting site positioned between the contact region and the semiconductor device.

In another embodiment, the present invention is an apparatus for use in testing a semiconductor device located on a wafer. The apparatus includes a wafer body. Means are coupled to the wafer body for contacting the semiconductor device. Means are integral the wafer body for providing an active component region on the wafer body. The active component region may include means for conditioning a test signal. The active component region may also include means for testing the semiconductor device.

The active wafer level contacting system in accordance with the present invention allows testing of high performance (speed) integrated circuit devices. The active wafer level contacting system provides test signal conditioning including precise impedance matching and minimal parasitic capacitances. Further, the active wafer contacting system includes active circuit devices integrated into the active wafer level contacting system for a highly efficient, economical testing system.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof, and wherein:

FIG. 11 is a partial top view showing the film in FIG. 10;

FIG. 12 is an enlarged fragmentary sectional view of the contact region in FIG. 10; and FIG. 13 is a process block diagram showing the film advance system of FIG. 9.

DETAILED DESCRIPTION OF THE PREFERRED EMBODIMENTS

The present invention is an active wafer level contacting system for coupling an integrated circuit device positioned on a wafer with a tester intended to effect analysis of the integrated circuit device. The preferred embodiment of the present invention includes an active wafer level contact system having at least a portion of the signal conditioning or integrated circuit test system located on the active wafer level contacting system.

The present invention provides an active level wafer contacting system for testing of high performance integrated circuit and semiconductor devices. The wafer level contacting system may include single conditioning and active circuit devices integrated into the wafer level contacting system.

Although the wafers referred to herein are preferably formed of silicon, it is recognized that they may be fabricated from other suitable substrates for fabrication of active circuits (i.e., band-gap appropriate).

In one preferred embodiment, the present invention includes a silicon wafer body. A contact region is coupled to the silicon wafer body for contacting the input/output (I/O) pads of the integrated circuit device. The contact region preferably includes an array of solder bumps which correspond to the I/O pads on the integrated circuit device for electro-mechanical coupling of the wafer to the integrated circuit device for performing a test thereon.

An active component region is located on the wafer body. The active component region includes active circuit components, such as test signal conditioning circuits, test circuits, or a complete testing apparatus for testing the integrated circuit device. The active circuit components may be located integral the silicon wafer using silicon wafer processing techniques, such as doping, etc. The silicon wafer body further includes a next level I/O region, including means coupled to the active component region for coupling the silicon wafer to a remote apparatus, such as an integrated circuit device tester.

Figure 1:
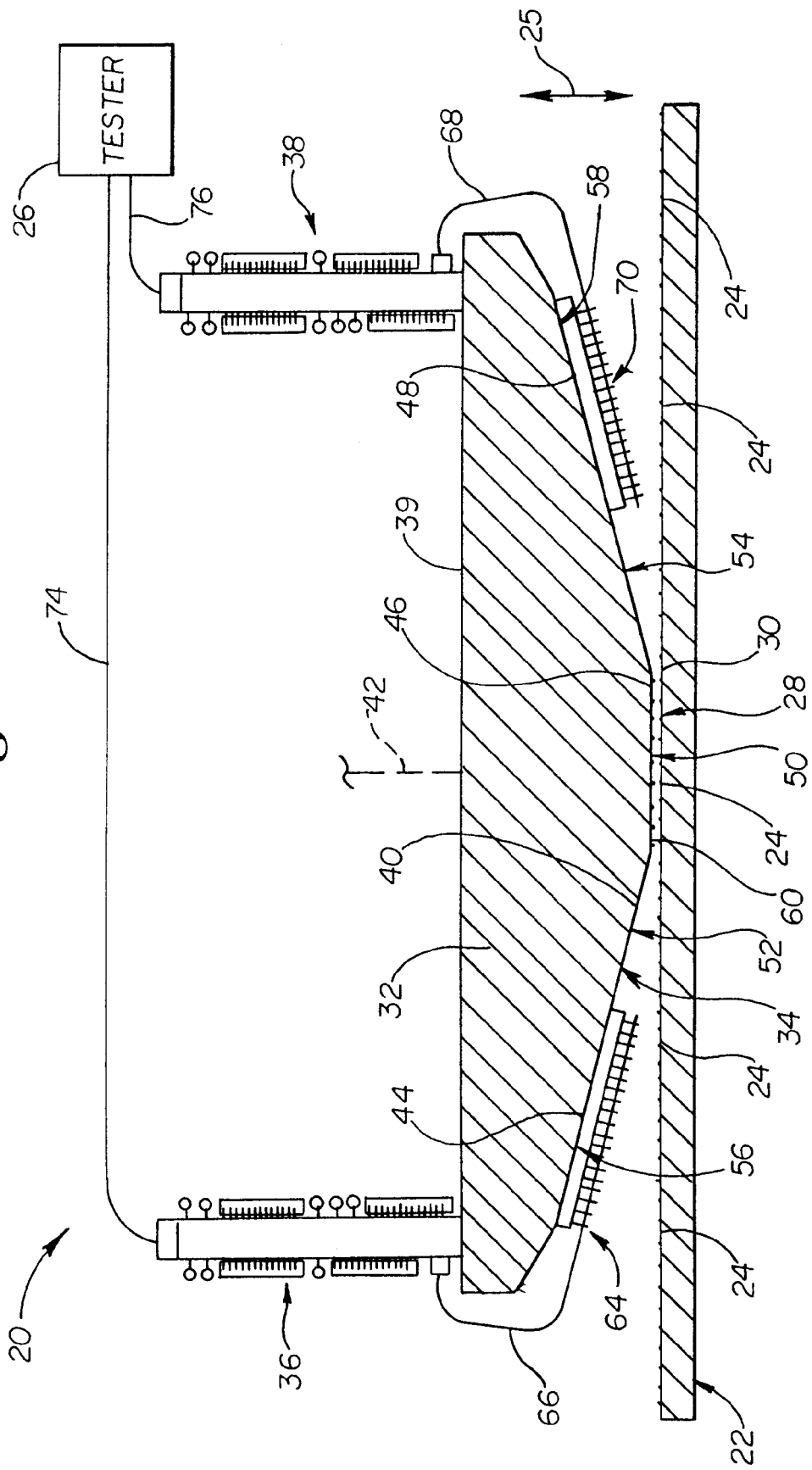
FIG. 1 is an enlarged sectional view of a first embodiment of the active wafer contacting system in accordance with the present invention.

Referring to FIG. 1, a wafer level contact system is generally shown at 20. The wafer level contact system is shown positioned over wafer under test 22, which includes devices 24 on a surface thereof, which may be tested one device at a time. The wafer level contact system 20 is lowered to electro-mechanically couple with a specific device 24 during performance testing of the device, indicated by directional arrows 25. The wafer level contact system 20 is coupled to tester 26 for performance testing of the devices 24 located on the wafer under test 22.

Wafer 22 contains a plurality of devices 24 which may be selectively coupled to wafer level contact system 20 for performance testing thereon. For the purposes of describing the wafer level contact system 20 herein, Applicant will refer to the specific device under test 28 located below the wafer level contact system 20. The device under test 28 is a semiconductor or integrated circuit device having input/output (I/O) pads 30 (shown as bumps).

The wafer level contact system 20 generally includes a support body 32 having an active silicon wafer 34 mounted thereon. Active silicon wafer 34 will be described in great detail later in this specification. The active silicon wafer 34 is electrically coupled to tester 26. It is recognized that active silicon wafer 34 may be electrically coupled to tester 26 through interface circuitry 36 and interface circuitry 38.

In one preferred embodiment, support body 32 is rigid, and formed of plastic. Support body 32 is generally rectangular shaped, and includes a top surface 39 and a bottom surface 40. Top surface 39 is mechanically coupled to a mechanism (not shown), indicated at 42, for moving the wafer level contact system 20 between a position where wafer level contact system 20 is in contact with the device under test 28, and a position where wafer level contact system 20 is not in contact with the device under test 28.

Bottom surface 40 generally includes a first slope region 44, a flat region 46, and a second sloped region 48. It is also recognized that the sloped regions may be curved or radiused. Active silicon wafer 34 is a flexible silicon wafer which may be formed and bent for securing to the support body bottom surface 40. Specifically, the active silicon wafer 34 is secured along first sloped region 44, flat region 46, and second sloped region 48. In construction, the active wafer 34 is formed using semiconductor processes. The active silicon wafer 34 is back-lapped to a thickness which supports bending the silicon wafer 34 about the small radius of curvatures along bottom surface 40 between first sloped region 44 and flat region 46, and flat region 46 and second sloped region 48. The large pad regions provide for next level I/O connection.

Active silicon wafer 34 includes a contact region 50, an active component region 52, an active component region 54, a connector pad region 56, and a connector pad region 58. Contact region 50 is flat and maintained parallel to the device under test 28, and includes contact elements 60 (shown as bumps) for electro-mechanically coupling with the device under test I/O pads 30. In the preferred embodiment, the contact elements 60 are solder bumps. Active component region 52 and large pad contact region 56 are located along the first sloped region 44, and active component region 54 and large pad contact region 58 are located along the second sloped region 48.

Active component region 52 and active component region 54 include active components, such as test circuits or signal conditioning circuits. Large pad contact region 56 includes contact pads 62 (shown in FIG. 2), which are electrically coupled to termination device 64. Interface circuitry 36 is electrically coupled to large contact pads 62 through shielded cable 66, which couples to the large contact pads 62 at termination device 64. Similarly, shielded cable 68 is terminated at termination device 70 for coupling interface circuitry 38 to large contact pads 62 through the termination device 70. Due to the first sloped region 44 and the second sloped region 48, the termination device 64, 70 and shielded cables 66, 68 do not interfere or come in contact with the top surface of the wafer under test 22.

Interface circuitry 36 is electrically coupled to remote tester 26, indicated at 74. Interface circuitry 38 is electrically coupled to remote tester 26, indicated at 76.

Figure 2:
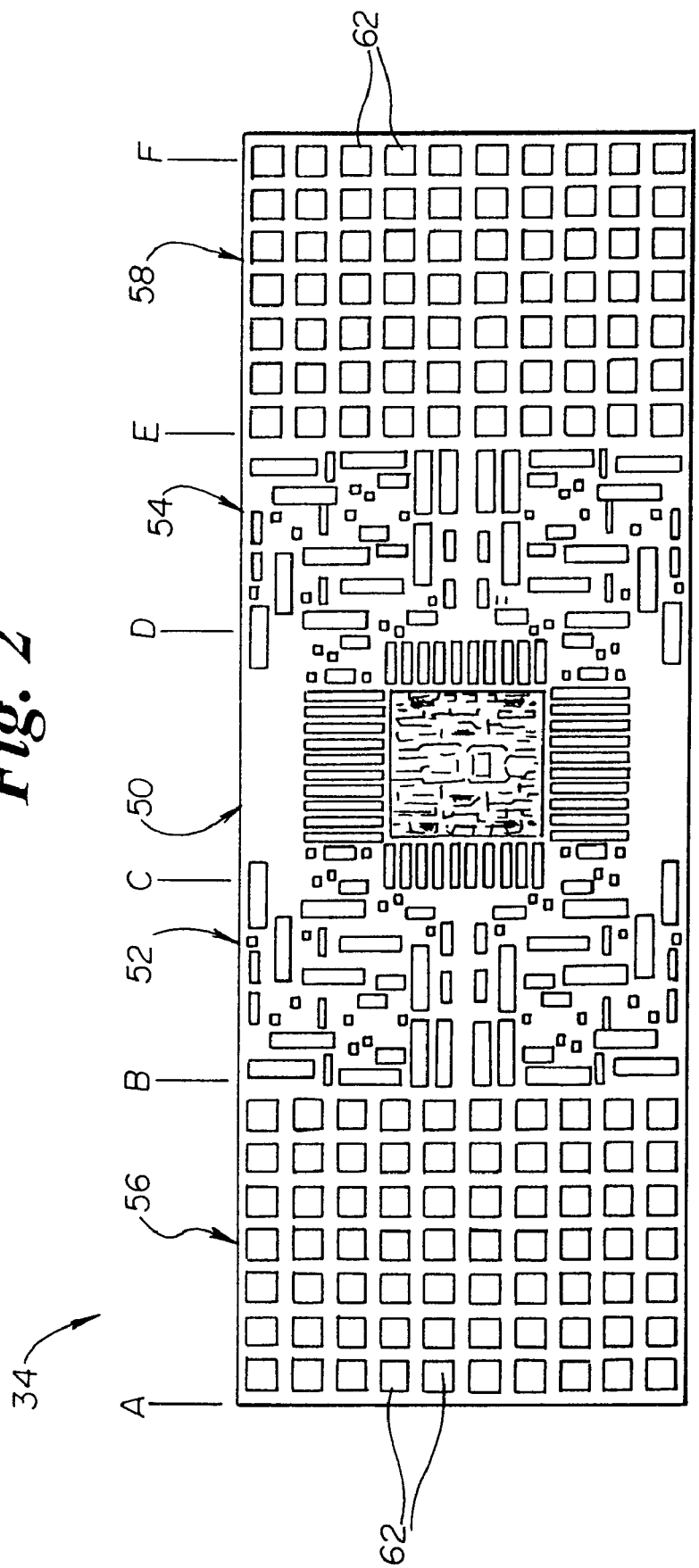
FIG. 2 is an enlarged top view of the silicon wafer shown in FIG. 1.

Referring to FIG. 2, a top view of one preferred embodiment of active silicon wafer 34 is generally shown. As shown, large pad contact region 56 generally extends between point A and point B; active component region 52 generally extends between point B and point C; contact region 50 generally extends between point C and point D; active component region 54 generally extends between point D and point E; and large pad contact region 58 generally extends between point E and point F. The active silicon wafer 34 is generally formed of silicon. It is recognized that the active silicon wafer 34 may be formed using wafer processing techniques, and may include a passivation layer over the active silicon wafer 34, having openings to contact points for protection of the circuit/devices located on the wafer 34. It is recognized that the passivation layer (not shown) may be formed of glass or $SiO_2$.

Figure 3:
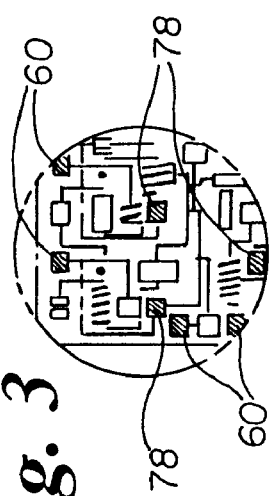
FIG. 3 is an enlarged partial top view taken at FIG. 3 in FIG. 2.

The contact region 50 is used for electro-mechanically coupling to the device under test 28. Referring also to FIG. 3, the contact region 50 includes contact elements 60 for electro-mechanically coupling to the device under test I/O pads 30. In one preferred embodiment, the contact elements 60 are contact bumps formed of solder for contacting with the device under test I/O pads 30. The contact elements 60 may be included around the outside of the area to be positioned over the device under test 28, and may additionally include interior contact elements 78, which are similar to contact elements 60, as previously described herein, for contacting with interior pads of the device under test 28 for performance of selective interior circuit tests. Further, it is recognized that the contact region 50 may include active circuit components, such as test circuitry or signal conditioning circuitry located between the contact elements 60 and interior contact elements 78 for signal conditioning or performing tests on the device under test 28.

Preferably, active circuit components are located within active component region 52 and active component region 54. The active component region 52 and active component region 54 includes electrical circuits which are part of the test system. Preferably, the circuits are integrated into the silicon wafer using silicon circuit processing techniques, such as silicon "doping". Alternatively, it is recognized that the circuits including circuit components may also be surface mounted on the silicon.

The circuits located within active component region 52 and active component region 54 may include electrical components for performing signal conditioning or testing functions. In one preferred embodiment, the active component region 52 and active component region 54 includes resistor and capacitor termination networks for conditioning the test signals between the contact elements 60, 78 and the tester 26, through impedance matching and minimization of parasitic capacitances which may cause interference in the performance signal.

By locating active components on the silicon wafer, the present invention is able to test high performance integrated circuit devices "at speed". Due to the closeness of the signal conditioning and test circuits to the contact elements, test signal interference caused by cantilevered contact elements coupled to long circuit leads is minimized or eliminated. Further, by locating circuit components within the active regions 52, 54, the wafer level contact system 20 takes advantage of silicon processing techniques, such as silicon doping, etc., to efficiently and economically form the circuit components integral the silicon wafer.

It is recognized that the active component regions 52, 54 may include simple signal conditioning circuits, or more complex logic gates, transistors, memory chips, or microprocessor based controllers for locating a portion of or all of the testing apparatus on the active silicon wafer 34. For example, active component regions 52, 54 may include signal conditioning/termination circuits. In another application, the active component region 52, 54 may further include localized test circuits for performing testing of the integrated circuit device on the active silicon wafer 34. A test signal is then sent back to the tester 36, which may include a microprocessor based controller or other logical operators responsive to the completed test. In another application, it is recognized that the complete testing unit may be located in active component region 52, 54. The complete testing unit may include signal conditioning circuits, transistors, logic gates, counters, and memory chips. If the complete testing unit is located on the active silicon wafer 34, a simple "go" or "no go" signal may be sent back to tester 26, which would operate as a "dummy tester" for acceptance or rejection of the integrated circuit device under test.

Figure 4:
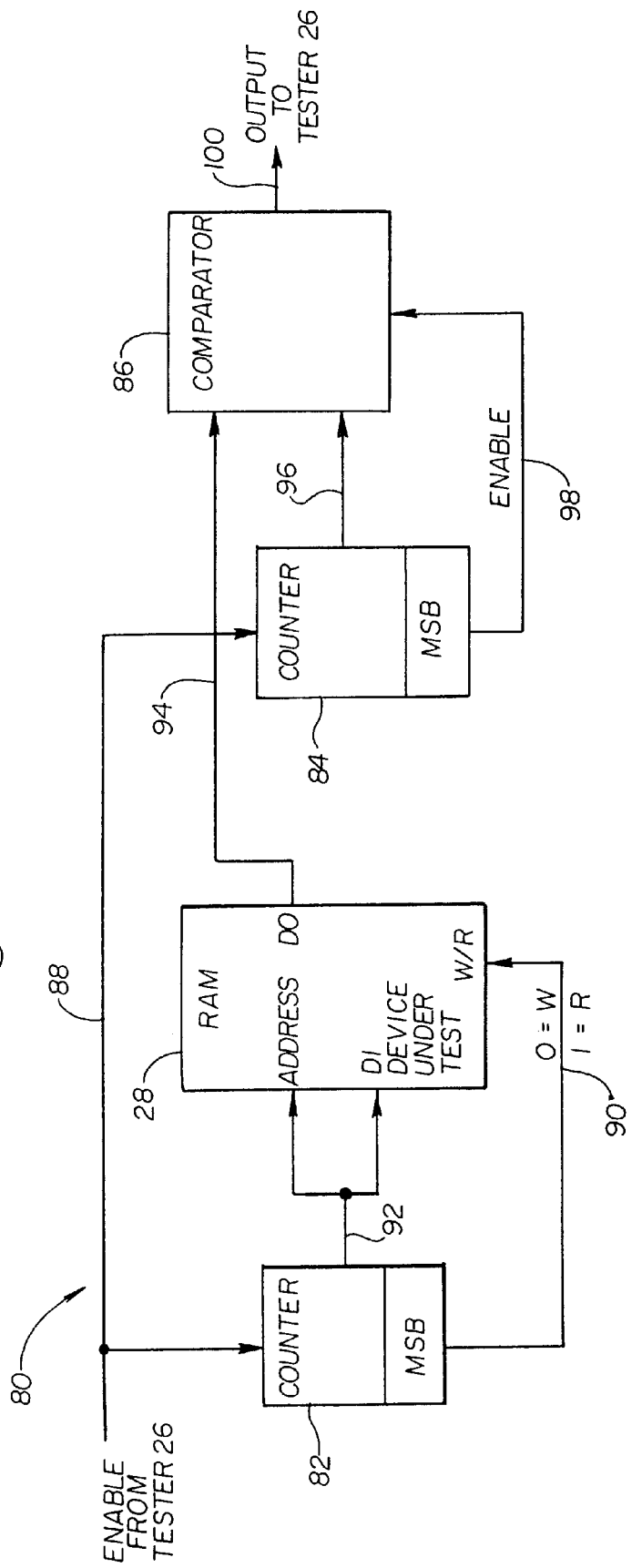
FIG. 4 is an example of a test circuit which may be located on the active wafer contacting system in accordance with the present invention.

Referring to FIG. 4, an example of a simple tester circuit which may be located in active component region 52 or active component region 54 for performing a local test on a device under test 28 is shown. In this example, the device under test 28 is a random access memory (RAM). The test circuit 80 includes a first counter 82, a second counter 84, and a comparator 86. First counter 82 and second counter 84 are enabled by a signal received from tester 26, indicated at 88. While the first counter 82 most significant bit is 0, the device under test 28 RAM is in the write mode, and data is written to each address location. When the first counter 82 most significant bit is a 1 (or goes high), device under test 28 RAM operates in the read mode and data is output to comparator 86, indicated at 94. Second counter 84 is also coupled to comparator 86, indicated at 96, and enabled simultaneously with first counter 82. When the second counter 84 most significant bit equals 1 (or goes high), the comparator 86 is enabled. At that time, comparator 86 compares the data output of the device under test 28 RAM, and the second counter input and provides an output to tester 26 representative of whether there is a read/write error in the device under test 28 RAM.

Since the test circuits are located on active silicon wafer 34 using silicon processing techniques, most any test circuit may be located on active silicon wafer 34. It is recognized that in the preferred embodiment, active circuit components would not be located at the junction where active component region 52 meets contact region 50, and where active component region 54 meets contact region 50, due to the bend at those locations.

Referring again to FIG. 2, large pad contact region 56 and large pad contact region 58 includes large contact pads 62 for coupling the active silicon wafer 34 to leads, such as shielded cables 66, 68 for connection to external or remote devices, such as tester 26. The large contact pads 62 provide a connection point between the micro-circuit components located on active silicon wafer 34 as a next level connection to external or remote devices. It is also recognized that circuitry, such as signal conditioning circuits or test circuits, may be located within the large pad contact region 56 or large pad contact region 58 between the large contact pads 62, which may be similar to the signal conditioning circuits and test circuits previously described herein.

The unique wafer level contact system 20, in accordance with the present invention, allows signal conditioning or device testing to be accomplished on the active silicon wafer 34. The unique contact elements, active component regions, and large pad contact regions which are integrated into the silicon, using semiconductor processing techniques, allow for economic and efficient testing of high performance semiconductor or integrated circuit devices.

Figure 5:
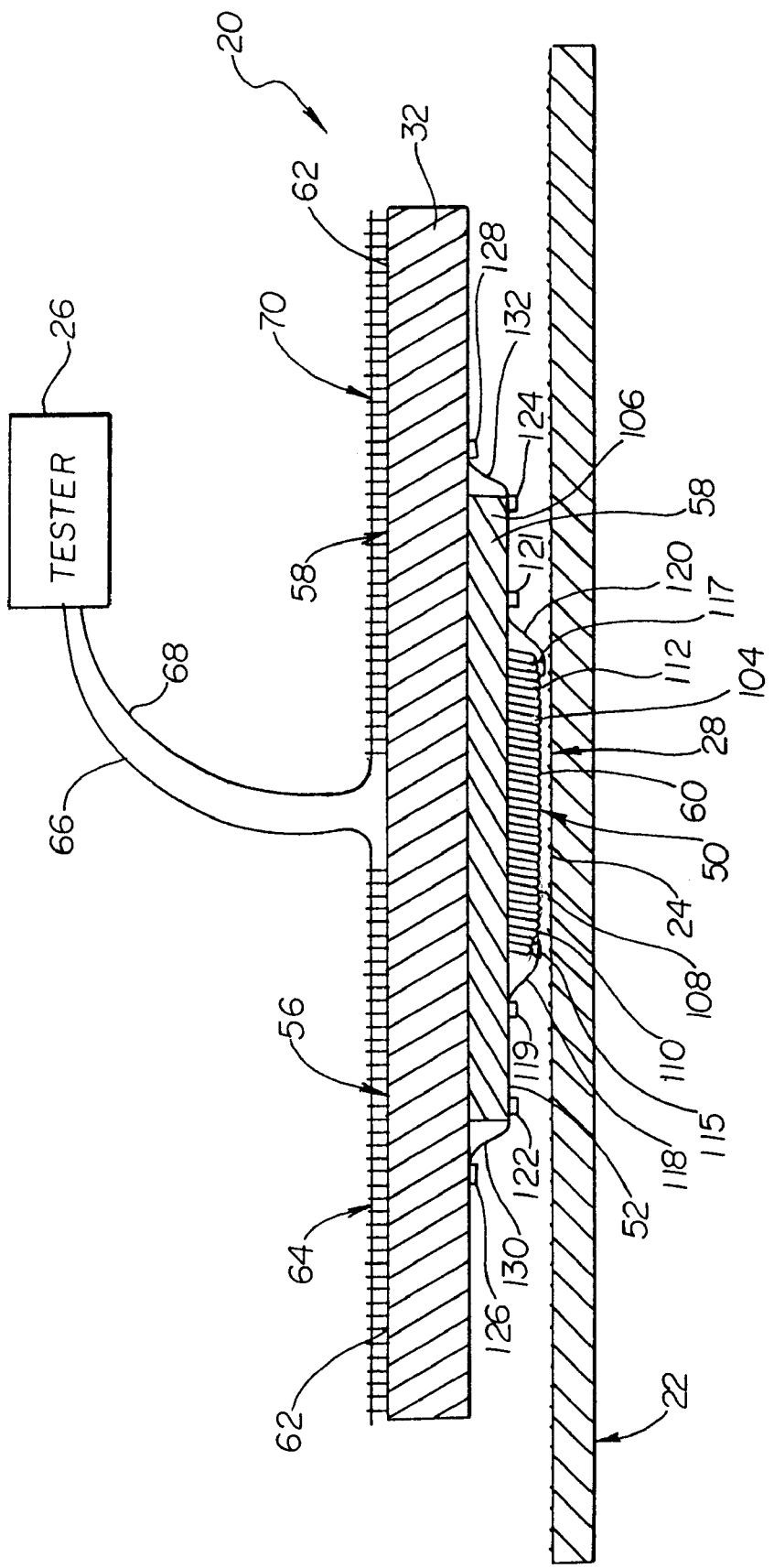
FIG. 5 is an enlarged sectional view of a second application of the present invention.

Referring to FIG. 5, another application of the wafer level contact system 20 in accordance with the present invention is generally shown. The wafer level contact system 20 includes a first active silicon wafer 104, a second active silicon wafer 106, and support body 32. The first active silicon wafer 104 includes a flat region 108, a sloped region 110, and a sloped region 112. First active silicon wafer 104 and second active silicon wafer 106 are formed of silicon and/or GaAs using semiconductor processing techniques. Support body 32 is formed of a generally rigid circuit board material, such as plastic. In this application, second active silicon wafer 106 is larger than first active silicon wafer 104. Support body 32 is larger than second active silicon wafer 106.

In this embodiment, contact region 50 is located on flat region 108, active component region 52 and active component region 54 are part of the second active silicon wafer 106, and large pad contact region 56 and large pad contact region 58 are located on support body 32.

As previously described herein, the device under test 28 I/O pads 30 mate with the contact region 50 contact elements 60 (and contact elements 78). The contact region 50 is flat and parallel with the device under test 28 test surface. Test signals are propagated from the contact region contact elements 60 through the sloped regions 110, 112 via routing traces 114, 116 (in the silicon) which terminate as wire bonding pads 115, 117. The bonding traces 114, 116 are connected to similar wire bonding pads 119, 121 located on active component regions 52, 58 through trace wires 118, 120. The active component regions 52, 54 contain signal conditioning circuits and/or test circuits which may be manufactured integral the silicon using semiconductor processing techniques, as previously described herein. Further, wire bonding pads 122, 124 are located on corresponding active component regions 52, 58 for electrical coupling and propagation of test signals between the active component regions 52, 58 and wire bonding pads 126, 128 through trace wires 130, 132.

At wire bonding pads 126, 128, test signals are propagated to large contact pads 62 located on support body 32 using vias and/or through holes in support body 32 (not shown). The large contact pads 62 are coupled to shielded cables 66, 68 through termination devices 64, 70.

Figure 6:
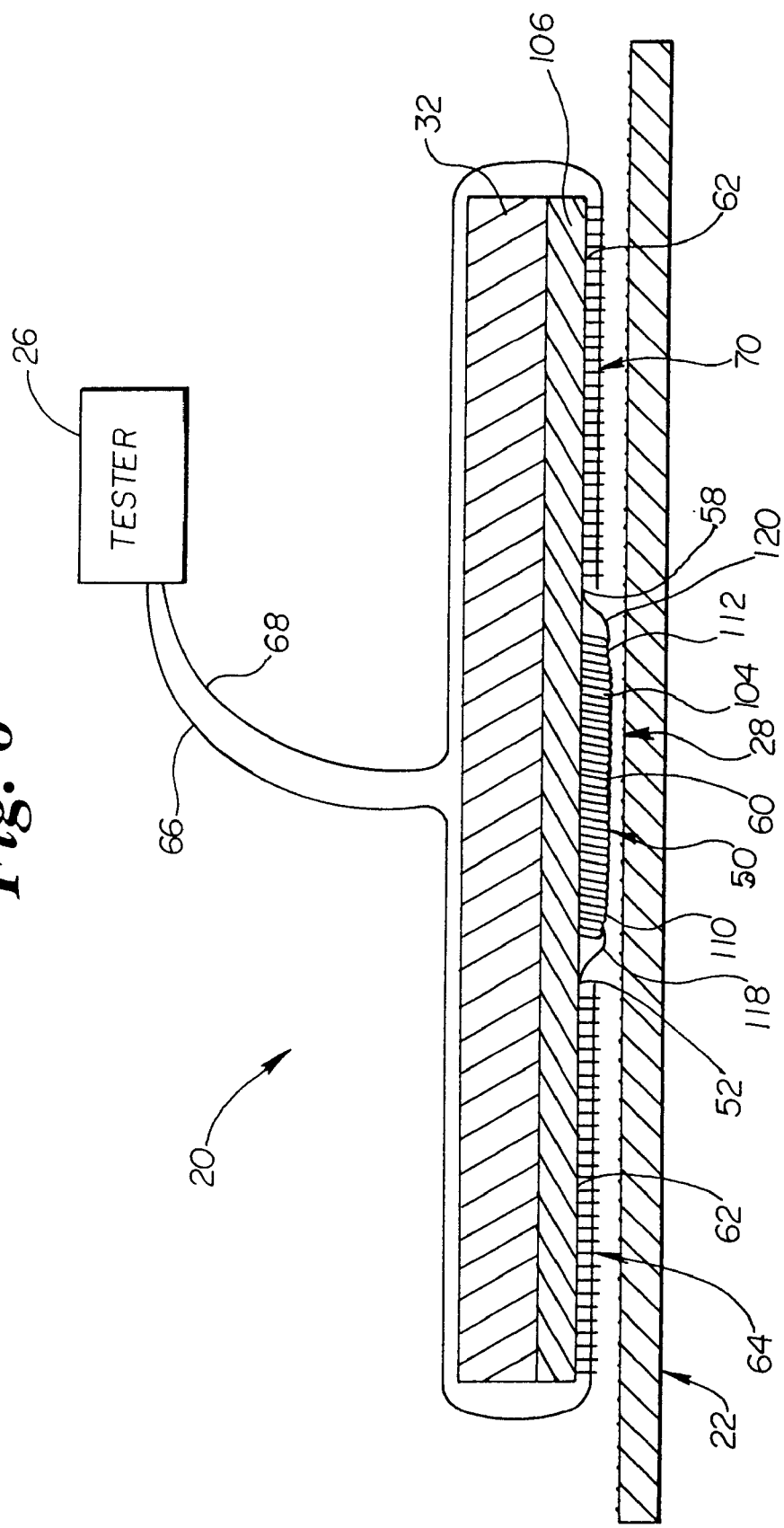
FIG. 6 is an enlarged sectional view of a third application of the present invention.

Referring to FIG. 6, another application of the wafer level contact system 20 in accordance with the present invention is generally shown, which is similar to the application shown in FIG. 5. In this application, second active silicon wafer 106 is made larger to be proximate the size of support body 32. Active component regions 52, 54, large pad contact regions 56, 58 (including large contact pad 62), and termination devices 64, 70 are all located on or integral the second active silicon wafer 106.

Figure 7:
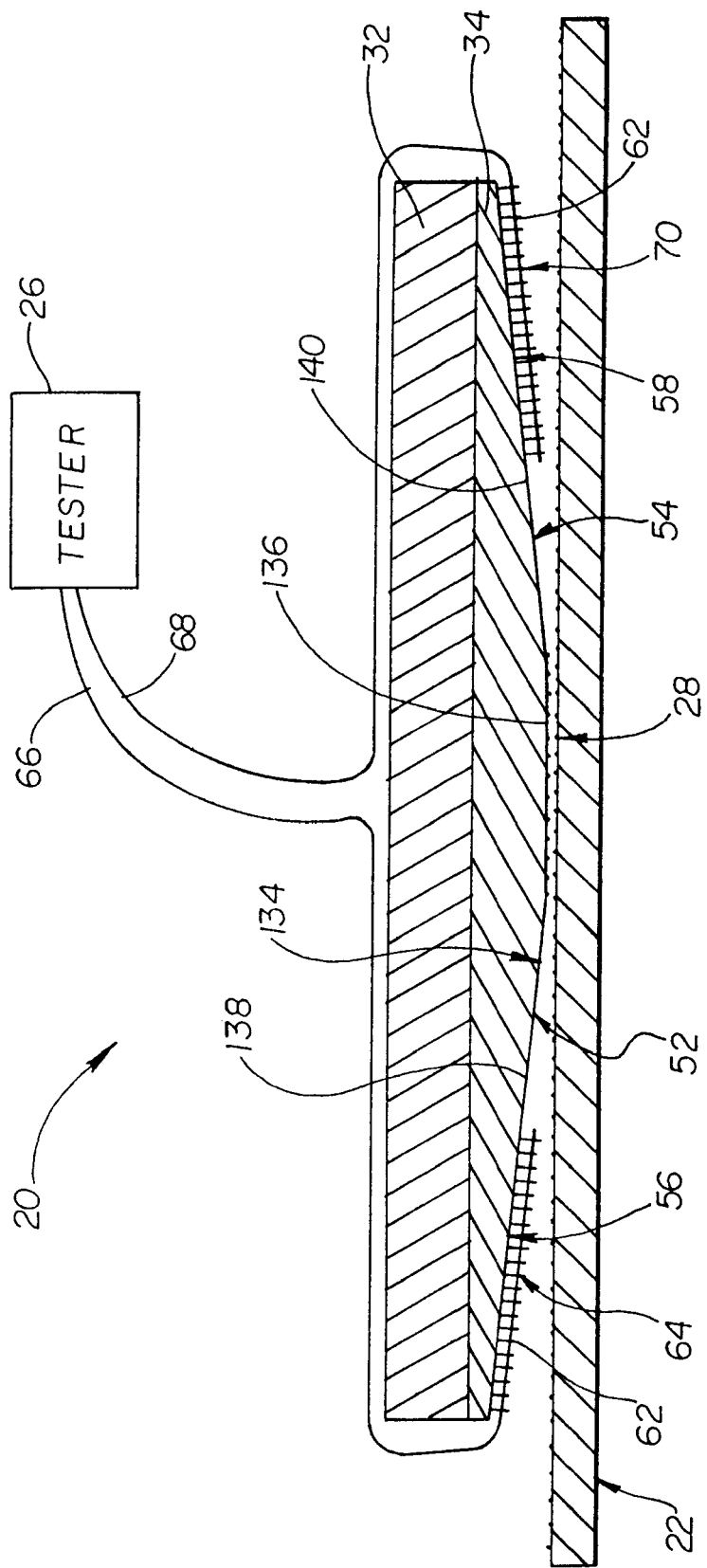
FIG. 7 is an enlarged sectional view of a fourth application of the present invention.

Referring to FIG. 7, another application of the wafer level contact system 20 in accordance with the present invention is shown. In FIG. 7, some element reference numerals have been left out for clarification. Active silicon wafer 34 is generally rigid, and is positioned between and coupled to support body 32. The active silicon wafer 34 generally includes a bottom surface 134 having a flat region 136, a first sloped region 138, and a second sloped region 140. Contact region 50 is located on flat region 136, active component region 54 and large pad contact region 56 are located on first sloped region 138, and active component 54 and large pad contact region 58 are located on second sloped region 140. Termination devices 64, 70 couple the corresponding large contact pads 62 to shielded cables 66, 68 which lead to tester 26.

Figure 8:
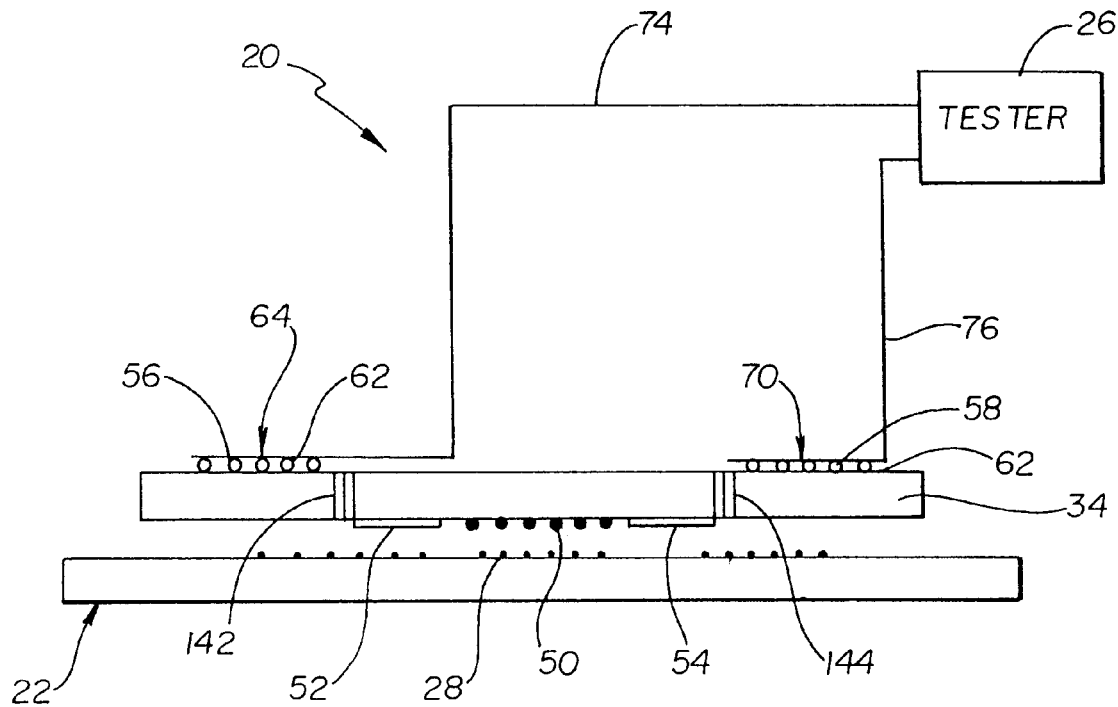
FIG. 8 is an enlarged sectional view of a fifth application of the present invention.

Referring to FIG. 8, another application of the present invention is shown. In this embodiment, the contact region 50, active component regions 52, 54, large pad contact regions 66, 68, and termination devices 64, 70 are all located on a common active silicon wafer 34 substrate. The active component regions 52, 54 are electrically coupled to the large contact pads 62 located in the large pad contact regions 56, 58 through vias in the active silicon wafer 34. The vias are formed by laser drilling or anisotropically through the active silicon wafer 34 and filling the vias with a metalized material.

Figure 9:
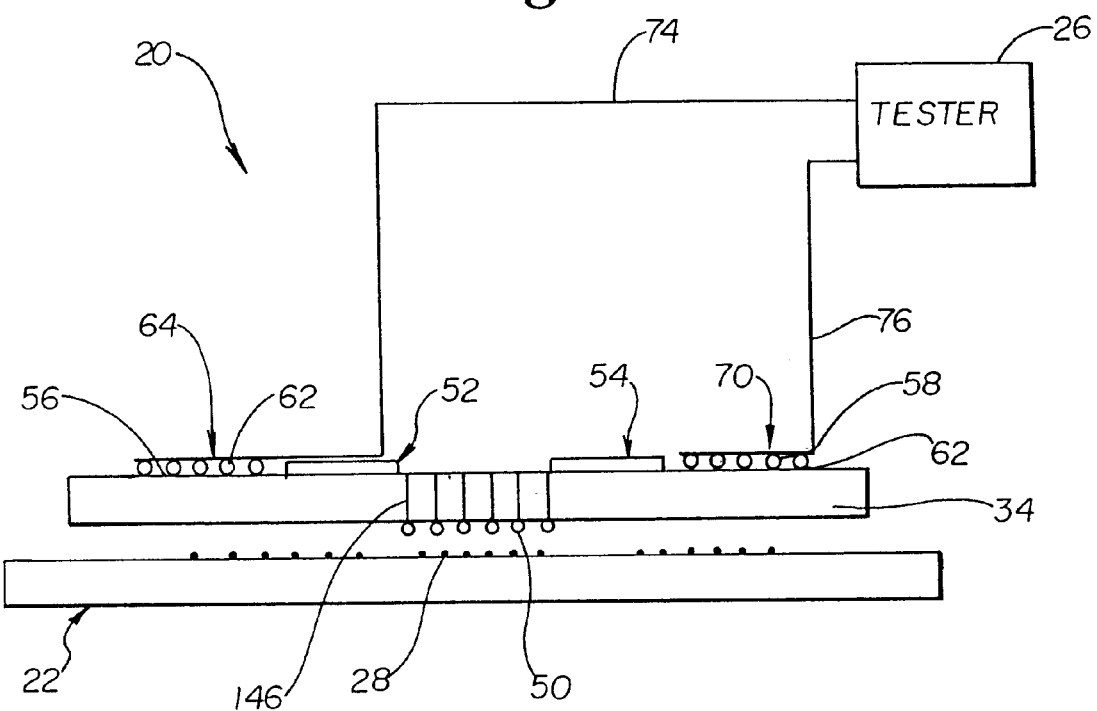
FIG. 9 is an enlarged sectional view of a sixth application of the present invention.

Referring to FIG. 9, another application of the wafer level contact system 20 in accordance with the present invention is shown, which is similar to the application of FIG. 8. In this application, the active component regions 52, 54 are located on the top of active silicon wafer 34. The active component regions 52, 54 are electrically coupled to the corresponding contact region 50 using vias 146, similar to those previously described herein.

Figure 10:
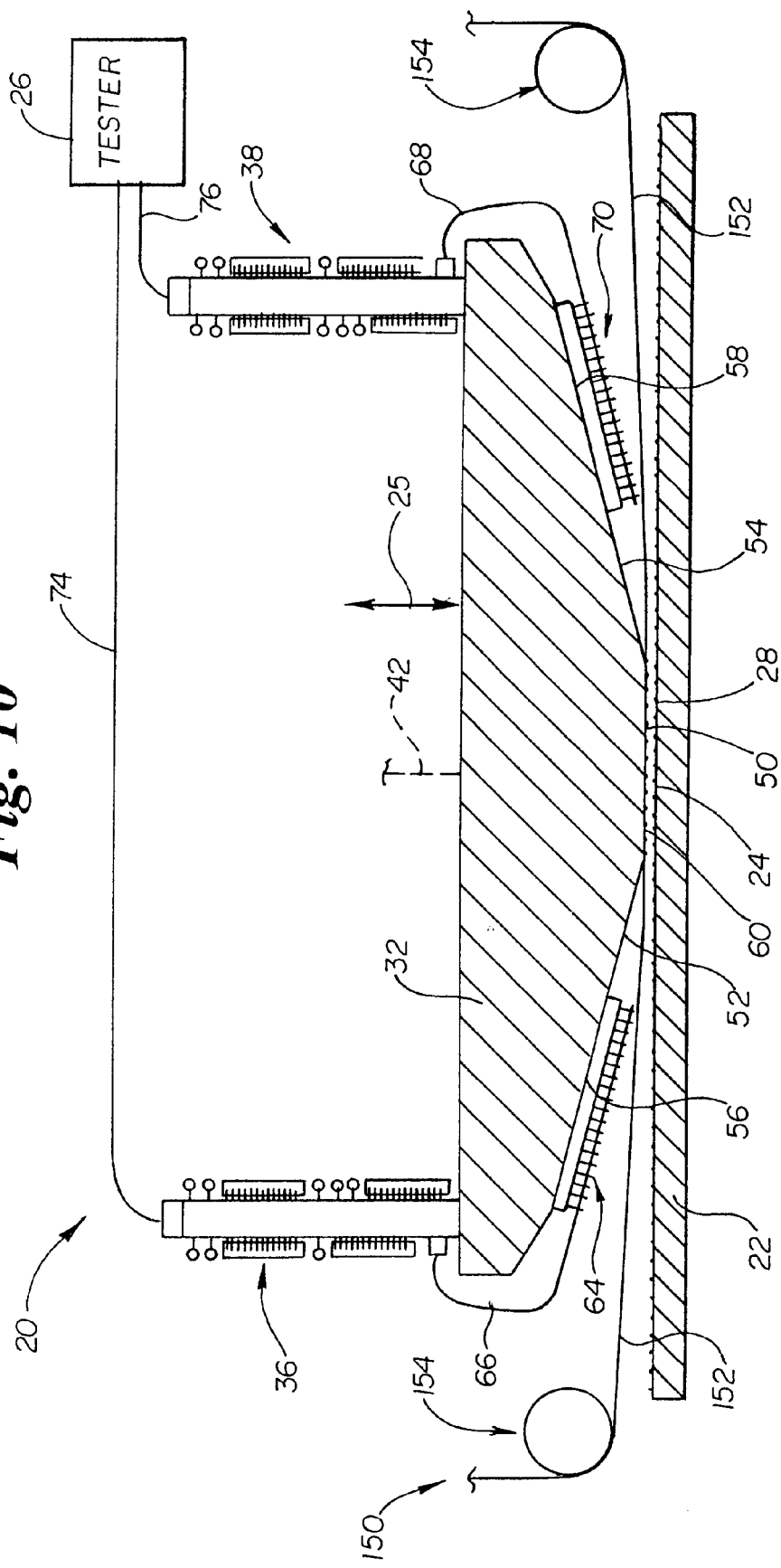
FIG. 10 is an enlarged sectional view of a seventh application of the present invention.

Referring to FIG. 10, another application of the wafer level contact system 20 in accordance with the present invention is generally shown, which is similar to the application shown in FIG. 1 as previously described herein. The wafer level contact system 20 further includes changeable contact system 150. During repeated use and testing, the contact elements located in the contact region 50 become worn and deformed. The changeable contact system 150 allows the contact elements to be changed out for extending the useful life of the wafer level contact system 20.

The changeable contact system 150 generally includes a film 152 coupled to a film advance system 154 (partially shown). The film 152 is interposed between the wafer level contact system contact region 50 and the device under test 28. Referring to FIG. 11, a top view of a portion of film 152 is generally shown. The film 152 generally includes film substrate 154, device sites 156, and index holes 158. The film substrate 154 is formed of a dielectric film material. The index holes 158 are used for indexing the position of the film 154 relative to the wafer level contact system 20, and for coupling to a sprocket mechanism for advancing the film, such as film advance system 154.

The device sites 156 include conductive metallic pads 160 separated by nonconductive regions 162, which may be part of the film 154. Deposited on the metal pads 160 are contact elements 164. In the preferred embodiment, the contact elements 164 are comprised of solder modules or solder bumps (similar to the contact element 60). The position and number of contact elements 164 correspond and mate with the corresponding contact region contact elements 60, 78, and the device under test I/O pads 30. In FIG. 11, only a small number of contact elements 164 are shown for clarity.

In reference to FIG. 12, one preferred embodiment of a device site 156 in cross-sectional view is shown. The film 154 includes a top surface 166 and a bottom surface 168. Metal pads 160 and contact elements 164 are located on the top surface 166 and the bottom surface 168. The corresponding contact elements 164 and metal pads 160 are electrically coupled together through the film substrate 154 using vias 170. The vias 170 generally consist of openings through the film substrate 154 having a conductive material, such as a metal deposited therein. The film 154 is normally tensioned against active silicon wafer 34.

Referring to FIG. 13, a block diagram of one embodiment of the changeable contact system 150 is generally shown at 172. The changeable contact system 150 generally includes a controller 174 for controlling logical operations of the changeable contact system 150. The controller 174 may be located within tester 26. Wafer position sensors 176 and film position tracking sensor 178 provide corresponding inputs 180, 182 to controller 174. Further, a test device counter 184 provides an input signal 186 to controller 174. Further, other control inputs 188 may provide other input signals 190 to controller 174. Based on the sensed input characteristics 180, 182, 186, and 190, controller 174 provides an output signal 192 to perform a test 194, an output signal 196 to advance film mechanism 198, and other output signals 200 to other output devices 202.

In operation, a device site 156 is positioned between the active silicon wafer 34 contact region 50, and the device under test I/O pads 30. The device sites 156 remain in tension against the contact region 50 during and after testing of the device under test 28. As the wafer level contact system 20 is moved to the next device 24 for testing, the device site 156 remains stationary relative to the contact region 50. After a desired number of semiconductor tests have been performed, indicated by test device counter 184, controller 174 provides an output signal 196 to advance film mechanism 198 for advancing the film 152 to the next device site 156. The position of the film device sites 156 relative to the contact region 50 are tracked using film position tracking sensor 178 and wafer position sensors 176. Further, other control inputs 188 may be utilized for registration of the device sites 156 relative to the contact region 50.

It is recognized that the unique active wafer level contact system 20 in accordance with the present invention has many applications. In addition to integrated circuit testing, the active component regions on the active silicon wafer may include burn-in circuits for burning in an integrated circuit device. Further, the wafer level contact system 20 may be designed to individually test each device located on the wafer under test 22, or a large contact system having a number of wafer level contact systems 20 coupled together may be designed for simultaneously testing of all devices located on the wafer. In one specific embodiment, it is recognized that "in situ" self test read only memory (ROM) circuits could be located on the active wafer level contacting system, making it no longer necessary to locate these circuits on a microprocessor.

Numerous characteristics and advantages of the invention have been set forth in the foregoing description. It will be understood, of course, that this disclosure is, and in many respects, only illustrative. Changes can be made in details, particularly in matters of shape, size and arrangement of parts without exceeding the scope of the invention. The invention scope is defined in the language in which the appended claims are expressed.

What is claimed is:

1. Apparatus for use in testing a semiconductor device fabricated on a wafer, the apparatus comprising:
   a contact system wafer body;
   a device contact region located on the contact system wafer body for contacting the semiconductor device;
   an active component signal conditioning region coupled to the device contact region; and
   means for directly coupling the active component signal conditioning region to a remote testing device, wherein said coupling means enables direct accessibility to said active component signal conditioning region.

2. The apparatus of claim 1, wherein the wafer body is formed of silicon.

3. The apparatus of claim 1, wherein the device contact region further includes contact elements located within the device contact region in a location corresponding to the I/O pads on the semiconductor device.

4. The apparatus of claim 3, wherein the contact elements are formed of solder.

5. The apparatus of claim 1, wherein the active component region includes circuit components located integral with the wafer.

6. The apparatus of claim 1, wherein the active component region includes a signal conditioning circuit.

7. The apparatus of claim 1, wherein the active component region includes a semiconductor device test circuit.

8. The apparatus of claim 7, wherein the semiconductor device test circuit includes a memory circuit.

9. The apparatus of claim 1, wherein the active component region includes a test system for testing the semiconductor device.

10. The apparatus of claim 1, wherein the means for coupling includes a next level I/O region.

11. The apparatus of claim 1, wherein the means for coupling includes a cable termination device.

12. The apparatus of claim 1, wherein the wafer body is flexible.

13. The apparatus of claim 12, wherein the flexible wafer body is secured to a rigid support member.

14. The apparatus of claim 13, wherein the rigid support member includes a sloped region and a flat region, wherein the device contact region is coupled to the flat region and the active component region is coupled to the sloped region.

15. The apparatus of claim 1, wherein the wafer body is generally rigid.

16. The apparatus of claim 1, wherein the wafer body includes:
   a first silicon substrate; and
   a second silicon substrate coupled to the first silicon substrate.

17. The apparatus of claim 16, wherein the contact region is located on the first silicon substrate and the active component region is located on the second silicon substrate.

18. The apparatus of claim 1, further including a changeable contact system having a device contacting site positioned between the device contact region and the semiconductor device.

19. An apparatus for use in testing a semiconductor device located on a wafer, the apparatus comprising:
   a contact system wafer body;
   means coupled to the wafer body for contacting the semiconductor device; and
   means integral with the wafer body for providing an active component region on the wafer body, wherein said means for providing an active component region is coupled to said means for contacting the semiconductor device.

20. The apparatus of claim 19, wherein the active component region includes means for conditioning a signal through impedance matching and minimization of parasitic capacitances.

21. The apparatus of claim 19, wherein the active component region includes means for testing the semiconductor device.

22. Apparatus for use in testing a semiconductor device fabricated on a wafer, the apparatus comprising:
   a contact system wafer body;
   a device contact region located on the contact system wafer body for contacting the semiconductor device;
   an active component signal conditioning region coupled to the device contact region; and
   means for immediately coupling the active component signal conditioning region to a remote testing device, wherein the active component signal conditioning region is spaced from a plane defined by the device contact region, in order to allow direct accessibility to said active component signal conditioning region.

23. The apparatus of claim 22 wherein said active component signal conditioning region is angularly spaced from a plane defined by the device contact region.

* * * * *